US007071515B2

(12) United States Patent  
Sheu et al.

(10) Patent No.: US 7,071,515 B2  
(45) Date of Patent: Jul. 4, 2006

(54) NARROW WIDTH EFFECT IMPROVEMENT WITH PHOTORESIST PLUG PROCESS AND STI CORNER ION IMPLANTATION

(75) Inventors: Yi-Ming Sheu, Hsinchu (TW); Da-Wen Lin, Taipin (TW); Cheng-Ku Chen, Hsinchu (TW); Po-Ying Yeh, Tainan (TW); Shi-Shung Peng, Hengshaw Shiang (TW); Chung-Cheng Wu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 49 days.

(21) Appl. No.: 10/619,114

(22) Filed: Jul. 14, 2003

(65) Prior Publication Data

US 2005/0012173 A1    Jan. 20, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/374; 257/506; 257/510; 257/519; 257/E21.546

(58) Field of Classification Search ............ 257/506, 257/510, 519, E21.546, 374; 438/435
See application file for complete search history.

(56) References Cited

U.S. PATENT DOCUMENTS

| | | | |
|---|---|---|---|
| 5,296,392 A | 3/1994 | Grula et al. | 437/34 |
| 5,726,095 A * | 3/1998 | Noble | 438/454 |
| 5,960,276 A | 9/1999 | Liaw et al. | 438/224 |
| 6,162,679 A | 12/2000 | Lin | 438/253 |
| 6,228,726 B1 | 5/2001 | Liaw | 438/294 |
| 6,245,639 B1 | 6/2001 | Tsai et al. | 438/424 |
| 6,277,697 B1 | 8/2001 | Lee | 438/296 |
| 6,331,458 B1 | 12/2001 | Anjum et al. | 438/197 |
| 6,342,429 B1 * | 1/2002 | Puchner et al. | 438/424 |
| 6,459,141 B1 * | 10/2002 | Yu et al. | 257/611 |
| 6,504,219 B1 | 1/2003 | Puchner et al. | 257/371 |
| 2003/0096466 A1 * | 5/2003 | Eklund et al | 438/197 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 251-261.*

* cited by examiner

*Primary Examiner*—William M. Brewster
(74) *Attorney, Agent, or Firm*—Thomas, Kayden, Horstemeyer & Risley

(57) ABSTRACT

A method to reduce the inverse narrow width effect in NMOS transistors is described. An oxide liner is deposited in a shallow trench that is formed to isolate active areas in a substrate. A photoresist plug is formed in the shallow trench and is recessed below the top of the substrate to expose the top portion of the oxide liner. An angled indium implant through the oxide liner into the substrate is then performed. The plug is removed and an insulator is deposited to fill the trenches. After planarization and wet etch steps, formation of a gate dielectric layer and a patterned gate layer, the NMOS transistor exhibits an improved Vt roll-off of 40 to 45 mVolts for both long and short channels. The improvement is achieved with no degradation in junction or isolation performance. The indium implant dose and angle may be varied to provide flexibility to the process.

20 Claims, 6 Drawing Sheets

NARROW WIDTH EFFECT IMPROVEMENT WITH PHOTORESIST PLUG PROCESS AND STI CORNER ION IMPLANTATION

FIELD OF THE INVENTION

The invention relates to a method of fabricating an integrated circuit in a semiconductor device. More particularly, the present invention relates to the formation of an NMOS transistor comprising a shallow trench isolation structure.

BACKGROUND OF THE INVENTION

As design rules shrink for MOSFET (Metal Oxide Semiconductor Field Effect Transistor) devices, there is a need to improve the reliability and performance of n-type (hereafter called NMOS) transistors. One particular problem with devices having a channel length smaller than about 1 micron is referred to as a reverse narrow width effect in which threshold voltage decreases as the width of a shallow trench isolation (STI) feature that separates active areas decreases. As a result, the NMOS transistor performance and reliability are degraded.

A conventional process for fabricating a NMOS transistor involves forming a pad oxide on a substrate and depositing a silicon nitride cap layer on the pad oxide. A lithography and plasma etch process is used to form a shallow trench in the substrate. After an oxide liner is grown on the sidewalls and bottom of the trench, a dielectric material is deposited to fill the trench. The dielectric material is made coplanar with the nitride layer by employing a planarization process. The nitride and pad oxide layers are usually removed with a wet etch that leaves a recess in the top corners of the STI feature. Subsequent steps involve formation of a gate oxide and formation of a gate layer on the gate oxide. The gate layer which may be polysilicon or a similar material often fills the recess at the top corners of the STI structure. The presence of this conducting material can induce a local electric field below the corners of the gate oxide in the final device which leads to a lower threshold voltage (Vt) and higher leakage current in the NMOS transistor. Therefore, a method is needed to reduce the effect of the localized electric field adjacent to the top corners of the STI structure in order to improve device performance and reliability.

A shallow trench is also formed during the fabrication of a DRAM capacitor in U.S. Pat. No. 6,162,679. Here a conformal conductive layer is formed in a trench and a photoresist layer is coated on the conductive layer and etched back in the trench to protect a portion of the conductive layer while the exposed conductive layer is removed by a second etch step.

One method to reduce the reverse narrow width effect is described in U.S. Pat. No. 5,960,276 where a boron implant is performed on the sidewalls of the etched trench before an insulating material fills the STI feature. However, P+ to P well isolation is expected to be degraded due to the boron implant compensating the N well at the STI sidewall. Similarly, N+ to P well junction leakage will increase due to the boron implant increasing the P well implant concentration at the STI sidewall.

In related art found in U.S. Pat. No. 6,228,726, a boron implant is used to dope a region under an open trench to improve latchup immunity and to increase the N+ to N well and P+ to P well isolation. A method of forming a boron doped silicon sidewall in a trench structure is described in U.S. Pat. No. 5,296,392 and involves a CVD process with dichlorosilane as the silicon source gas and diborane as the source of the boron dopant.

In U.S. Pat. No. 6,277,697, a tilted boron implant is performed through a pad oxide into a substrate. A trench is etched into the substrate and leaves a pocket of boron dopant in the substrate adjacent to the upper corners of the STI structure. After the poly gate is formed, the doped region mitigates the influence of the local intensified electric field caused by polysilicon filling the etched recess at the top corners of the STI structure. Since the implant is performed prior to high temperature oxidation and anneal steps in the trench fabrication, a considerable amount of dopant is likely to be lost from the implanted regions.

Because of the tendency for boron to diffuse away from its implanted location during subsequent thermal cycles and thereby cause a depletion of dopant in desired regions, a reverse narrow channel effect (RNCE) is likely to occur. The RNCE is reduced in U.S. Pat. No. 6,245,639 by a large angle N ion implant into sidewalls of a trench which blocks B ions from migrating to an STI/well interface.

A method is described in U.S. Pat. No. 6,331,458 for implanting indium ions in an active region between two field oxide regions formed by a LOCOS method. The method teaches that the lower mobility of indium compared with boron in a substrate results in a lower threshold voltage skew but does not address the influence of the etched recess in an STI structure on reverse narrow width effect in an NMOS transistor which may also be referred to as Vt roll-off. Furthermore, the method does not allow for a higher dopant concentration in a region of the substrate adjacent to the STI corners and a lower concentration in other parts of the active region.

An indium ion implant is also employed in U.S. Pat. No. 6,504,219 in which the indium ions are vertically implanted into the bottom of an STI trench to strengthen a p-well and provide punchthrough protection. However, the method does not address the problem of Vt roll-off caused by an etched recess at top corners of the STI structure.

Therefore, a method is desirable for fabricating an NMOS transistor having an STI structure that enables the flexibility of placing a high concentration of dopant selectively in the active region adjacent to top corners of an STI structure. A preferred process does not degrade the isolation or junction performance and is adjustable to permit various degrees of threshold voltage improvement.

SUMMARY OF INVENTION

One objective of the present invention is to provide a means of improving the reverse narrow width effect without degrading isolation and junction leakage.

A further objective of the present invention is to provide a method of improving NMOS narrow width Vt roll-off with high flexibility.

A still further objective of the present invention is to achieve an improvement in reverse narrow width effect without implementing new equipment that will drive up the cost of fabrication.

These objectives are accomplished in one embodiment by providing a substrate that may be doped or undoped. A pad oxide is formed on the substrate followed by deposition of a silicon nitride cap layer. A conventional patterning and etching sequence is employed to produce a shallow trench in the substrate. Next, a thin oxide liner is grown on the sidewalls and bottom of the trench. A photoresist is coated to fill the trench and cover the substrate. Then the photoresist is etched back to a level that is slightly below the surface of the substrate to form a recessed plug in the trench. A key feature of the present invention is an angled implant of indium ions through the oxide at the top corners of the trench and into the adjacent region of substrate. The photoresist is removed and a p-type dopant may then be vertically implanted through the bottom of the trench. An insulator material is deposited to fill the trench above the level of the silicon nitride layer. A conventional wet etch method that is used to strip the silicon nitride and pad oxide is likely to produce a small groove in the insulator layer near where the top of the substrate abuts the shallow trench. A gate dielectric layer is then formed on active regions where the pad oxide was previously removed followed by deposition of a gate layer on the gate dielectric surface. Additional processes such as patterning the gate layer and forming source/drain regions that are well known to those skilled in the art are employed to finish the fabrication of a NMOS transistor.

The advantage of the indium implant is that the indium dopant has a lower tendency to migrate than boron and serves to mitigate the effect of the localized electrical field that is induced by the presence of the gate layer in the grooves formed within the insulator layer at top corners of the shallow trench.

The present invention is also a semiconductor device comprising an NMOS transistor that includes a substrate having an active region formed between shallow trench isolation structures. Each shallow trench has an oxide liner along its sidewalls and bottom and is filled with an insulator material to a level above the substrate. A gate dielectric layer covers the active region and a patterned gate layer is formed on the gate dielectric layer. An indium dopant is located near the surface of the substrate in a region that abuts the top corners of the shallow trench. Other p-type dopants may be present at the surface of the substrate in the active region but the total concentration of dopants is highest in the indium doped regions. This device is especially useful in improving NMOS Vt roll-off for transistors having a channel length of about 1 micron or less.

BRIEF DESCRIPTION OF THE DRAWINGS

The features and advantages of a semiconductor device according to the present invention and further details of a process of fabricating such a device in accordance with the present invention will be more clearly understood from the following description taken in conjunction with the accompanying drawings in which like reference numerals designate similar or corresponding elements, regions, and portions, and in which

FIG. 4b is a top-down view of the structure shown in FIG. 4a.

DETAILED DESCRIPTION OF THE INVENTION

The present invention is a method of improving the reliability and performance of NMOS transistors in a semiconductor device by improving the Vt roll-off for short channel devices. However, the method is also effective for long channel devices. The invention is not limited to the specific examples described herein and the figures are not necessarily drawn to scale.

Figure 1A:
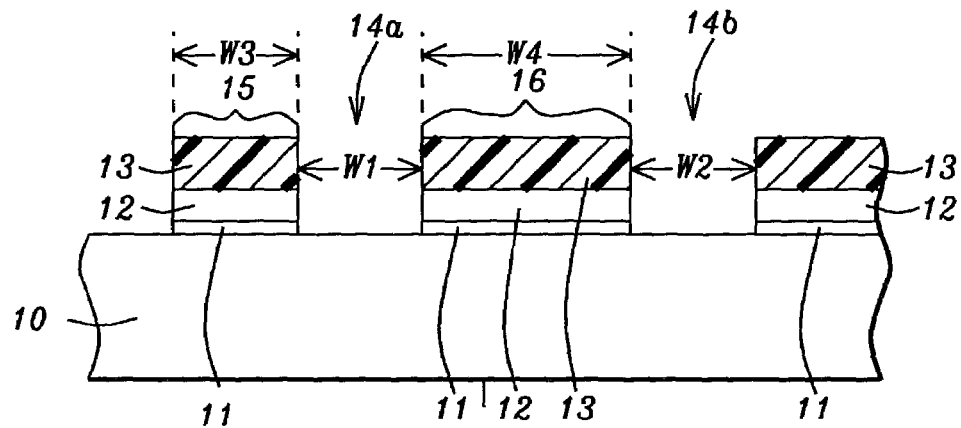
FIG. 1a is a cross-sectional view and FIG. 1b is a top-down view of a patterning and etching method to define active regions on a substrate.

Referring to FIG. 1a, a substrate 10 is provided which is typically silicon but may be based on silicon-on-insulator, silicon-germanium, or gallium-arsenide technology. Furthermore, the substrate 10 may be doped or undoped. A pad oxide layer 11 is formed on substrate 10 and has a thickness in the range of about 30 to 200 Angstroms. A cap layer 12 which is preferably silicon nitride is then deposited on pad oxide 11 by a chemical vapor deposition (CVD) or plasma enhanced CVD technique. Cap layer 12 has a thickness between about 200 and 5000 Angstroms.

Trenches 14a, 14b are formed by first coating a photoresist layer 13 on cap layer 12 and then patternwise exposing and developing photoresist layer 13. Trenches 14a, 14b may have equal widths ($w_1=w_2$) or the widths $w_1$ and $w_2$ may be different. Widths $w_1$, $w_2$ may have a size that ranges from less than 100 nm to several microns. Trenches 14a, 14b will subsequently be etched into substrate 10 and filled with an insulator layer to form shallow trench isolation features. Trenches 14a, 14b are transferred through cap layer 12 and pad oxide 11 with a plasma etch to expose portions of substrate 10. Active areas 15, 16 between trenches are active areas upon which NMOS transistors will be built. The widths of active areas 15, 16 are $w_3$, $w_4$, respectively, and may vary in size from less than 100 nm to several microns. The dimension $w_3$ may or may not be equal to $w_4$. There may be other active areas (not shown) on substrate 10 that have widths $w_X$ that may be equal to or different than dimensions $w_3$, $w_4$.

Figure 1B:
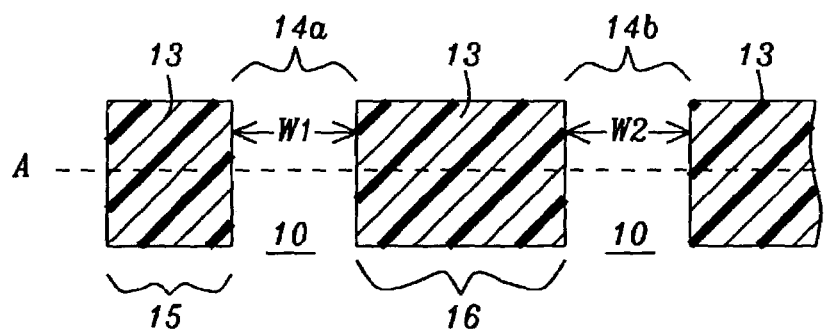

A top-down view of the partially formed device structure shown in FIG. 1a is depicted in FIG. 1b. Note that the cross-section shown in FIG. 1a is obtained by cutting through the partially formed device structure in FIG. 1b on a line A. Active areas 15, 16 appear as rectangular shapes that are surrounded by exposed substrate 10.

Figure 2A:
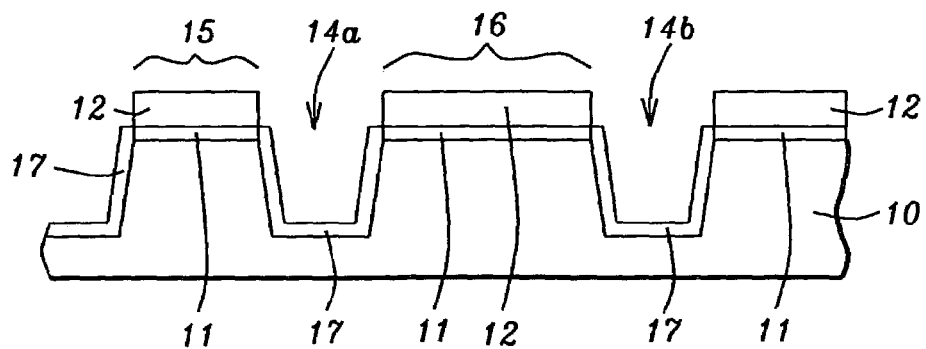
FIG. 2a is a cross-sectional view and FIG. 2b is a top-down view depicting formation of an oxide liner in shallow trenches located between active regions in a substrate.
Figure 2B:
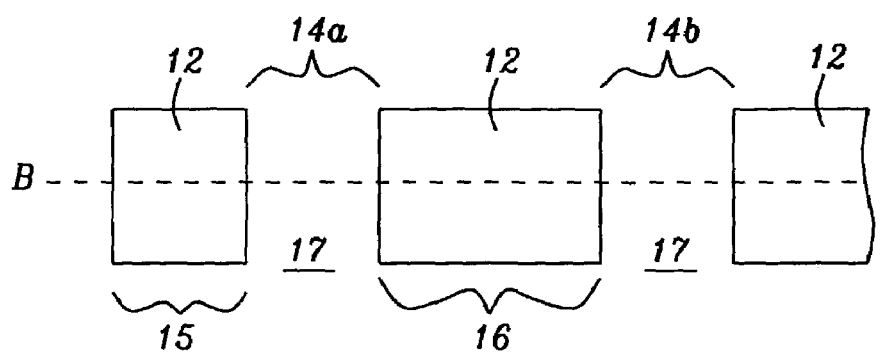

Referring to FIG. 2a, trenches 14a, 14b are etched into substrate 10 by a conventional method to a depth of about 100 to 8000 Angstroms and preferably between 1500 and 5000 Angstroms. A liner 17 is formed on the substrate 10 within trenches 14a, 14b. Preferably, liner 17 is a thermal oxide layer which is grown to a thickness between about 30 and 500 Angstroms. A top-down view of the partially formed structure shown in FIG. 2a is depicted in FIG. 2b. The cross-section shown in FIG. 2a is obtained by cutting through the structure in FIG. 2b on a line B.

Figure 3:
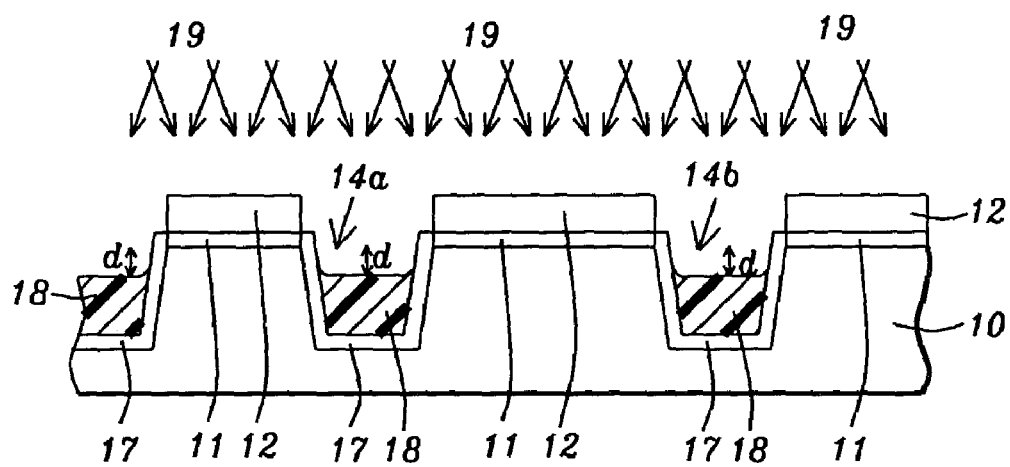
FIG. 3 is a cross-sectional view showing formation of a photoresist plug in shallow trenches and an angled indium implant according to an embodiment of the present invention.

Referring to FIG. 3, a photoresist or a polymer layer 18 is spin coated on cap layer 12 and also fills trenches 14a, 14b. Layer 18 is preferably a positive tone photoresist but may also be a negative tone photoresist or a polymer without a photoactive component since the purpose of layer 18 is to form a plug in trenches 14a, 14b and not to function as a patterning layer. Photoresist or polymer layer 18 is typically baked at a temperature in the range of about 90° C. to 150° C. to remove any residual organic solvent and to form a more uniform coating. In a subsequent step, a plasma etch is used to remove photoresist or polymer layer 18 on cap layer 12 and etch back the polymer or photoresist to form a plug layer 18 in trenches 14a, 14b that is recessed to a distance d below the surface of substrate 10. Preferably, the distance d is about 300 to 1700 Angstroms. The etch back step exposes the top of liner 17 in trenches 14a, 14b near where the surface of substrate 10 abuts liner 17.

A key feature of the present invention is an angled implant 19 of indium ions through trenches 14a, 14b and through exposed liner 17. Some of the angled implant also penetrates through pad oxide layer 11. The indium ions are preferably implanted at an energy of between 10 and 300 keV and most preferably at 130 keV. The dosage is from about 1e12 to 5e13 ions/cm$^2$ and preferably is about 2e13 ions/cm$^2$. The angle of the implant is critical and is maintained between 0 degrees (vertical implant) and 60 degrees.

Figure 4A:
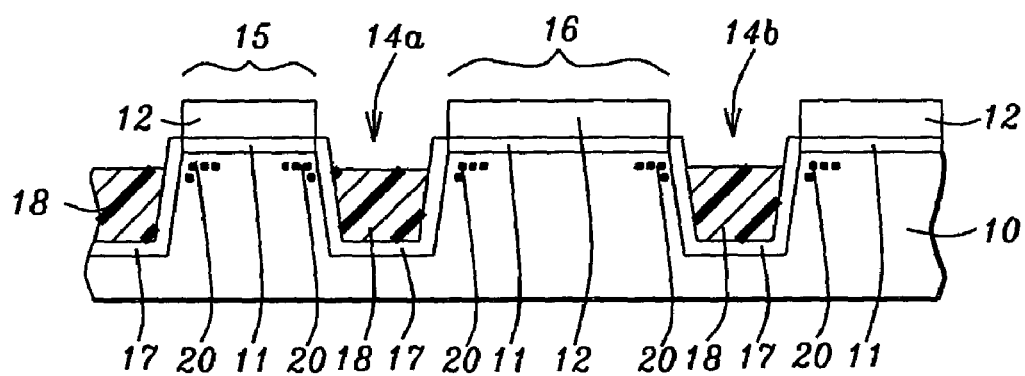
FIG. 4a is a cross-sectional view illustrating the location of doped regions near the top corners of shallow trenches according to an embodiment of the present invention.
Figure 4B:
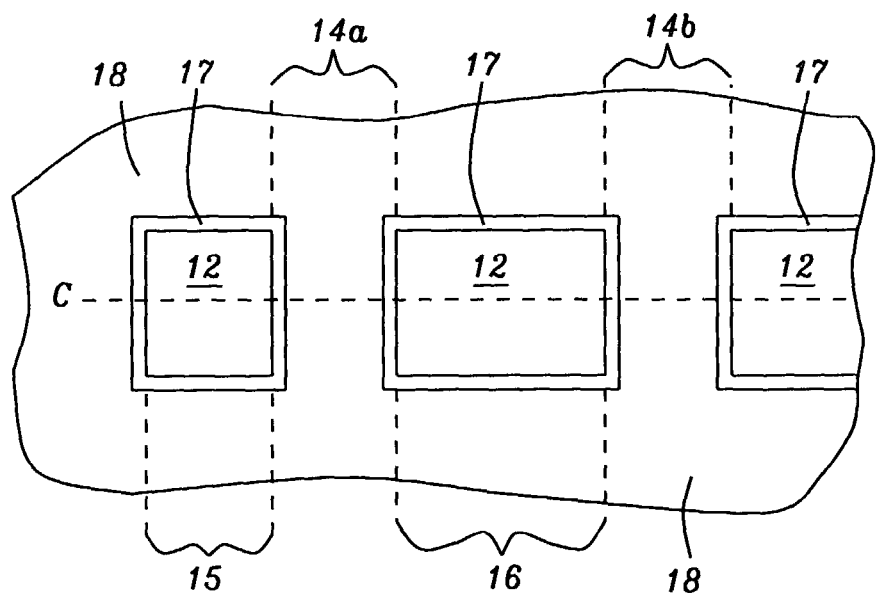

Referring to FIG. 4a, a doped region 20 having a thickness in the range of about 30 to 1000 Angstroms and with an indium concentration in the range of $10^{14}$ to $10^{19}$ atoms/cm$^3$ is formed in substrate 10 adjacent to the top of liner 17 and below pad oxide layer 11. Note that a doped region 20 is formed in substrate 10 on each side of trenches 14a, 14b and extends away from liner 17 to a distance of 0 to about 1000 Angstroms. A top-down view of the structure shown in FIG. 4a is depicted in FIG. 4b. The cross-section shown in FIG. 4a is obtained by cutting through the structure in FIG. 4b on a line C.

Figure 5:
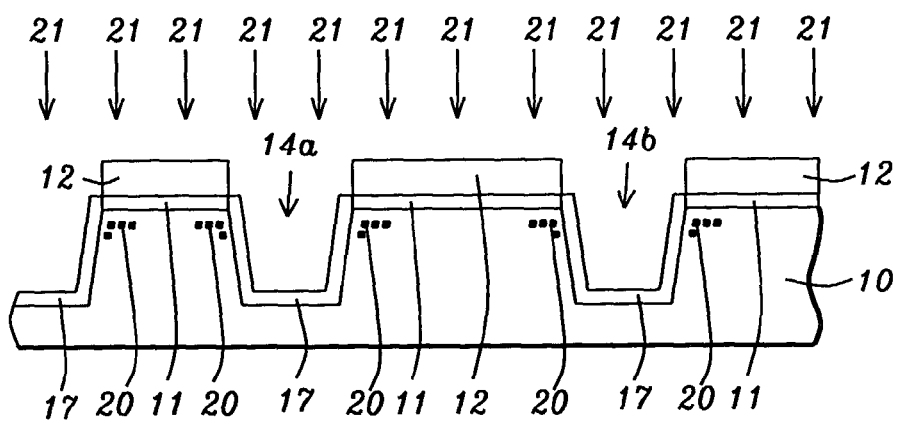
FIG. 5 is a cross-sectional view showing removal of the photoresist plug and an optional implant through the bottom of the shallow trenches according to an embodiment of the present invention.

Referring to FIG. 5, plug layer 18 is removed by a plasma ashing method using soft etch conditions known to those skilled in the art so as not to damage the liner 17. A conventional wet clean process may be employed to remove any photoresist residues after the ashing step. In one embodiment, cap layer 12 is etched back slightly (not shown) and a vertical p-type implant 21 of boron or indium ions is then performed to form a doped region in substrate 10 below the bottom of trenches 14a, 14b and increase the dopant in region 20 at the top of trenches 14a, 14b for the purpose of increasing threshold voltage in a narrow channel device. In another embodiment, the implant 21 is accomplished before the formation of a plug layer 18 and is performed on the partially formed structure shown in FIG. 2a. Preferred conditions for implant 21 are an energy of 10 to 300 keV to give an indium dosage of 1e12 to 5e13 ions/cm$^2$. In still another embodiment, there is no further ion implantation before trenches 14a, 14b are filled.

Figure 6:
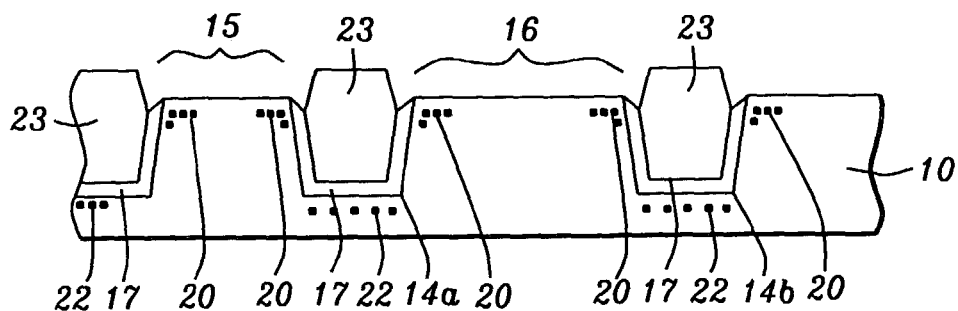
FIG. 6 is a cross-sectional view depicting the partially formed transistor after an insulator is deposited in the shallow trenches and the nitride and pad oxide layers are removed according to a method of the present invention.

Referring to FIG. 6, when ion implant 21 is employed, a doped region 22 is formed below trenches 14a, 14b. Optionally, there is no doped region 22 when ion implant 21 is not used. At this point, trenches 14a, 14b are filled with an insulator layer 23 such as $SiO_2$ or a low k dielectric material. Insulator layer 23 is deposited to a level that is higher than cap layer 12. Next, a planarization process such as a chemical mechanical polish (CMP) step is utilized to make insulator layer 23 coplanar with cap layer 12. Cap layer 12 and pad oxide 11 are then removed by a conventional method such as a wet etch, for example. The wet etch may also partially etch the tops of liner 17 and insulator layer 23 and form a groove in insulator layer 23 adjacent to top corners of substrate 10 in active areas 15, 16. Shallow trench isolation features comprised of trenches 14a, 14b, liner 17, and insulator 23 are now complete.

In one embodiment, an implant (not shown) may be performed at this point on the exposed substrate 10 in active areas 15, 16 to compensate for well dopant loss near liner 17. The dopant which may be boron, indium, or $BF_2$ is typically implanted at an equal concentration across active areas 15, 16. Thus, the total concentration of dopants in active areas 15, 16 is still greater in regions 20 than in other parts of active areas 15, 16. Dopants in implanted regions are activated by an anneal process such as a rapid thermal anneal step at about 800° C. to 1000° C., for example.

Figure 7A:
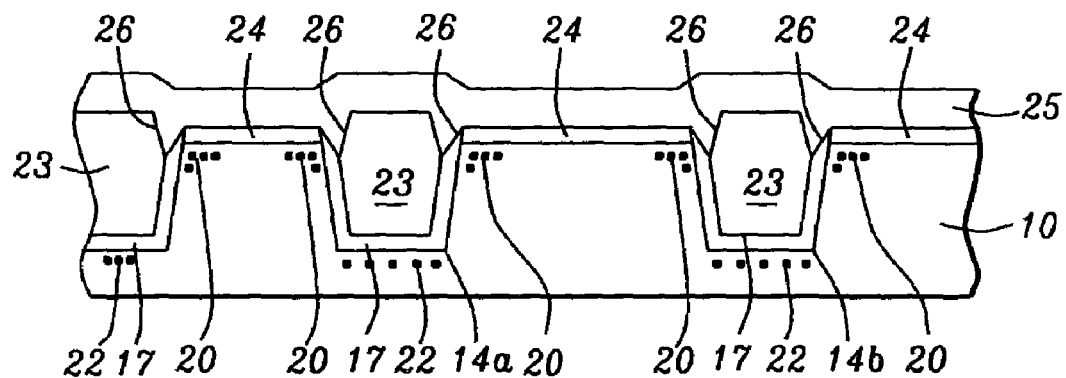
FIG. 7a is a cross-sectional view and FIG. 7b is a top-down view showing a partially formed transistor after a gate dielectric and a gate layer are deposited on active regions according to an embodiment of the present invention.

Referring to FIG. 7a, a gate dielectric layer 24 is formed on active areas 15, 16. Gate dielectric layer 24 may be an oxide grown by a rapid thermal oxidation or a similar oxidation method. Optionally, those skilled in the art will recognize that dielectric layer 24 may be comprised of an upper high k dielectric material such as a metal oxide on a lower interfacial layer on substrate 10. A conductive material such as doped or undoped polysilicon or amorphous silicon is deposited on gate dielectric layer 24 and patterned by conventional means to form a conformal gate layer 25. Gate layer 25 also fills the grooves 26 that were produced by the wet etch during removal of cap layer 12 and pad oxide 11. Gate layer 25 has a thickness in the range of about 300 to 5000 Angstroms.

The advantage of doped regions 20 in the present invention is that the indium dopant mitigates the effect of a localized electric field that is induced by the presence of gate layer 25 in grooves 26. In prior art, this localized electrical field causes an increased amount of leakage current and a lower threshold voltage (Vt). Moreover, the indium provides an advantage over boron dopant since indium has a much lower tendency to migrate away from regions 20 when the substrate is subjected to thermal cycles during NMOS transistor fabrication or in the final device. The lower mobility of indium ensures a higher concentration of dopant in the regions 20 where the dopant has the most influence on the localized electric field caused by gate layer 25 in grooves 26.

The NMOS transistor is completed by well known steps including the formation of spacers adjacent to the gate and heavily doped source/drain regions in substrate regions not covered by the gate or spacers. Those details are not provided here since they are known to those skilled in the art and are not pertinent to this invention.

Figure 7B:
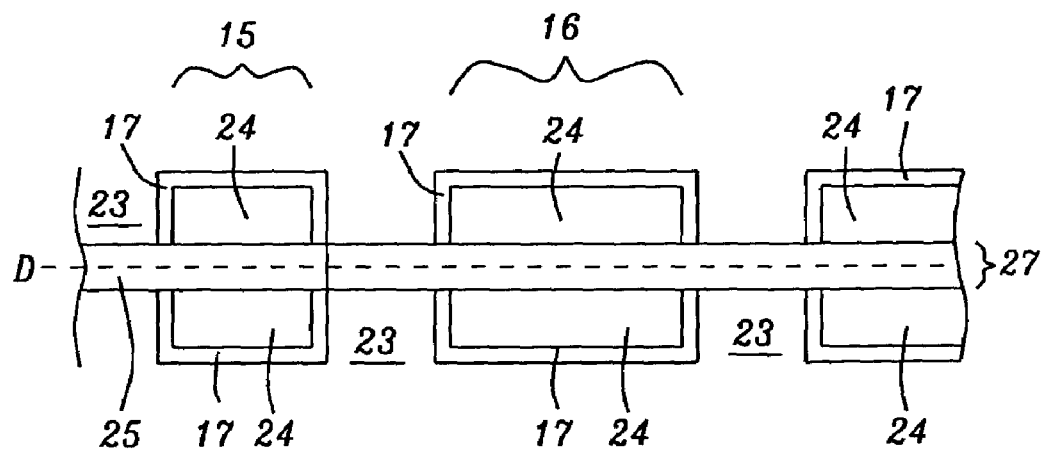

A top-down view of the partially formed device shown in FIG. 7a is depicted in FIG. 7b. The cross-section shown in FIG. 7a is obtained by cutting through the device in FIG. 7b on a line D. Gate layer 25 is shown to have a channel width 27.

Figure 8:
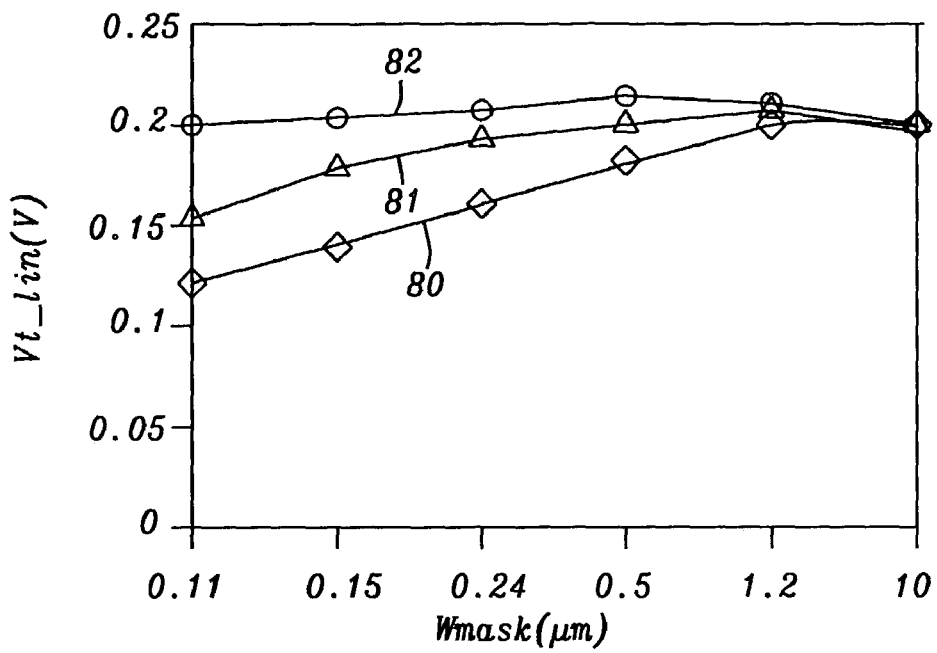
FIGS. 8 and 9 are plots of Vt vs. channel width that demonstrate how Vt roll-off is improved in NMOS transistors that are fabricated according to a method of the present invention.

The effectiveness of the indium dopant in substrate regions 20 in improving the long channel NMOS Vt roll-off is demonstrated in FIG. 8. A plot of mask width (represented by $w_3$ or $w_4$ in FIG. 1a) vs. Vt is shown for a long channel width 27 of 10 microns. Curve 80 indicates how Vt decreases rapidly (high degree of roll-off) with a shrinking width $w_3$ (or $w_4$) in a standard process with no indium implant in a substrate near STI corners. The situation is improved in curve 81 which represents a NMOS transistor having doped regions 20 formed by an indium implant dose of 2e13 ions/cm$^2$ according to a method of the present invention. A 40 mVolt improvement is noted on the plot (separation of curves 80 and 81) for the smallest mask width of 0.11 microns. Curve 82 indicates that a higher indium implant dose of 5e13 ions/cm$^2$ in the present invention is capable of improving the Vt roll-off even further than a lower implant dose represented by curve 81.

Figure 9:
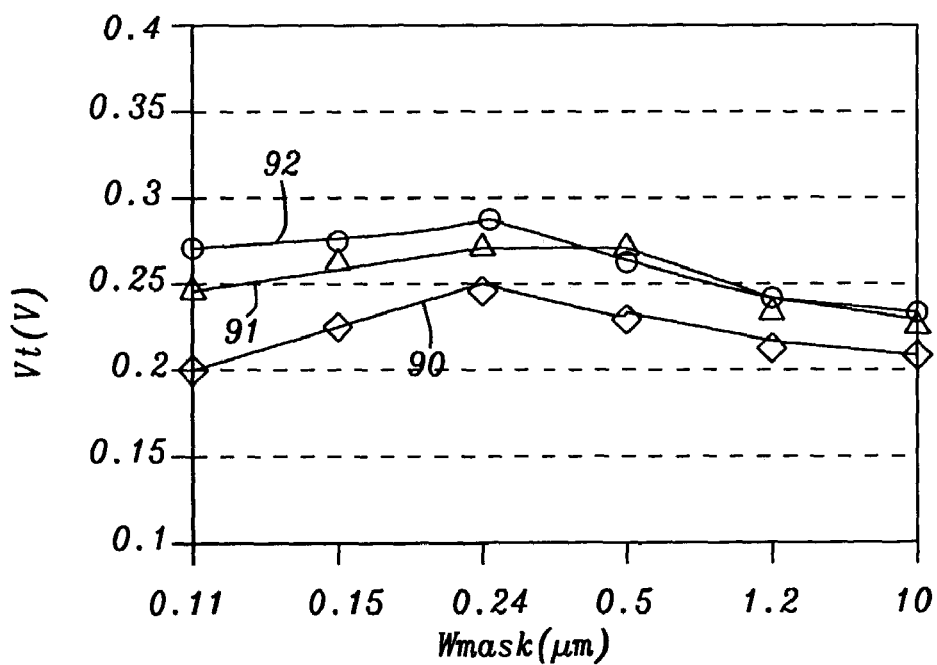

Referring to FIG. 9, a plot of mask width (represented by $w_3$ or $w_4$ in FIG. 1a) vs. Vt is shown for a short channel width 27 of 0.1 microns. Curve 90 indicates how Vt decreases rapidly (high degree of roll-off) as width $w_3$ (or $w_4$) shrinks below about 0.24 microns in a standard process with no indium implant in a substrate near STI corners. The situation is improved in curve 91 which represents a NMOS transistor having doped regions 20 formed by an indium implant dose of 2e13 ions/cm$^2$ according to a method of the present invention. A 45 mVolt improvement from curve 90 to 91 is noted on the plot for the smallest mask width of 0.11 microns. Curve 92 indicates that a higher indium implant dose of 5e13 ions/cm$^2$ in the present invention is capable of improving the Vt roll-off even further than a lower implant dose represented by curve 91.

The Vt roll-off improvement is achieved in the present invention by employing existing ion implant tools and thereby minimizes any cost of including the indium implant step in the fabrication scheme. Any increase in cost is more than offset by the improved reliability and performance realized by the NMOS transistor that is produced by the present invention. Furthermore, the indium implant is performed in a manner that does not degrade junction or isolation performance. The method is flexible since the indium implant dose and angle can be varied to modify the dopant concentration and size of the implant region 20.

Figure 10:
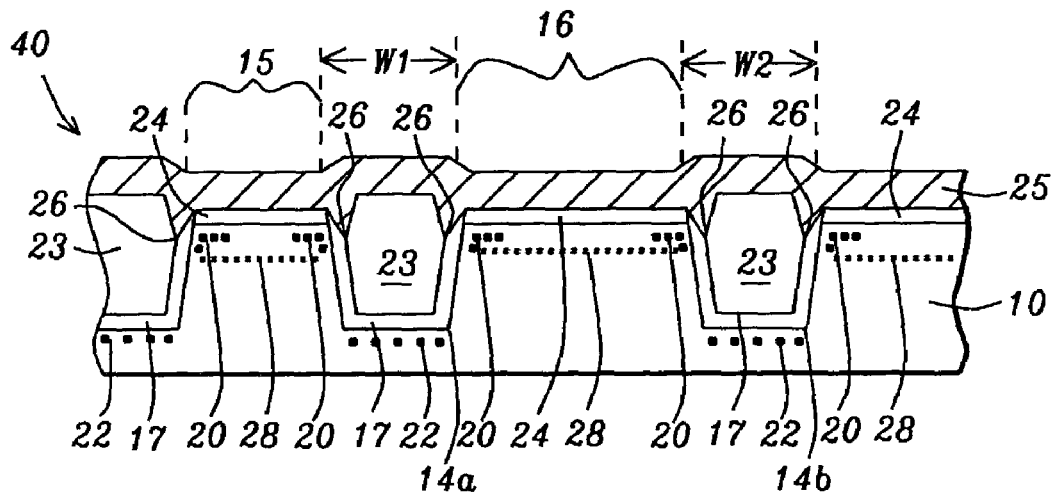
FIG. 10 is a cross-sectional view and FIG. 11 is a top-down view of partially formed transistors that have indium doped regions near the top corners of shallow trench isolation structures according to one embodiment of the present invention.

The invention is also a semiconductor device comprised of a NMOS transistor that includes a substrate with shallow trench isolation (STI) features and active areas as illustrated in FIG. 10. STI features are comprised of a liner and an insulator layer that is formed on the liner and extends upward to form a planar surface at a level above the substrate. The active areas include a doped substrate upon which a gate dielectric layer and a gate layer are sequentially formed. There is an indium dopant in top regions of the substrate adjacent to STI features that improves the Vt roll-off when the NMOS transistor structure has either a long channel or short channel.

Referring to FIG. 10, a cross-sectional view of a partially formed NMOS transistor 40 is depicted. NMOS transistor 40 includes a substrate 10 that has active areas 15, 16 and shallow trenches 14a, 14b. Substrate 10 is typically silicon but may also be based on silicon-on-insulator, silicongermanium, or gallium-arsenide technology.

Shallow trenches 14a, 14b have a depth of about 300 to 8000 Angstroms and preferably between 1500 and 5000 Angstroms with sloped sidewalls so that the bottom of the trench has a narrower width than the top opening of the trench. Shallow trenches 14a, 14b have a liner 17 that is preferably a thermal oxide layer with a thickness of about 50 to 300 Angstroms that is on the bottom of the trenches and extends upwards along the sidewalls to a point near the top of substrate 10. The remainder of shallow trenches 14a, 14b are filled with an insulator layer 23 that is an oxide such as SiO$_2$ or a low k dielectric material. Insulator layer 23 extends above the surface of substrate 10 and has a top that may be flat or slightly rounded. Small grooves 26 may be present in shallow trenches 14a, 14b near the top of liner 17. The width $w_1$ of the top of shallow trench 14a may or may not be equal to the width $w_2$ of the top of shallow trench 14b. Furthermore, there may be other shallow trenches (not shown) in substrate 10 that have a width $w_y$ that may or may not be equivalent to $w_1$ or $w_2$. The widths $w_1$, $w_2$ of the top of shallow trenches 14a, 14b may vary from less than 100 nm to several microns.

Figure 11:
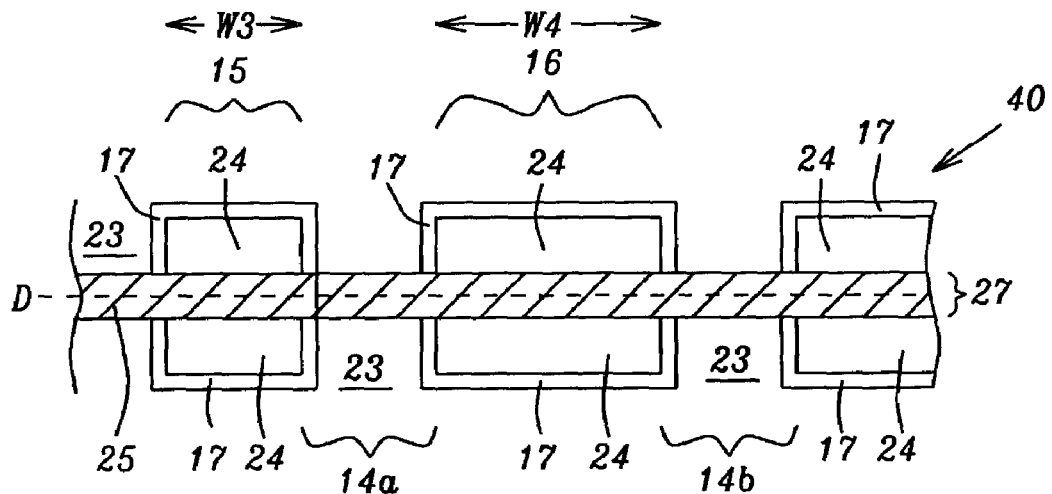

Referring to FIG. 11, a top down view of partially formed NMOS transistor 40 is depicted. A cut along line D is used to obtain the cross-sectional view shown in FIG. 10. Active area 15 has a width $w_3$ and active area 16 has a width $w_4$. The width $w_3$ may or may not be equal to $w_4$ and widths $w_3$, $w_4$ may vary in size from less than 100 nm to several microns. Furthermore, other active areas (not shown) may be present on substrate 10 that have a width $w_x$ which may or may not be the same as widths $w_3$, $w_4$. A patterned gate layer 25 is formed over active areas 15, 16 and over trenches 14a, 14b but does not entirely cover the active areas 15, 16 or trenches 14a, 14b. Gate layer 25 has a channel width 27 which may be less than 100 nm.

Referring again to FIG. 10, a gate dielectric layer 24 is formed above each active area 15, 16. Gate dielectric layer 24 may be SiO$_2$ or may be comprised of an upper high k dielectric layer such as a metal oxide on a lower interfacial layer. Gate dielectric layer 24 has a thickness of about 8 to 500 Angstroms. A gate material such as doped or undoped polysilicon or amorphous silicon forms a conformal and continuous gate layer 25 on gate dielectric layer 24 and over shallow trenches 14a, 14b. Gate layer 25 has a thickness in the range of about 500 to 3000 Angstroms and may also fill grooves 26 that are formed at top corners in insulator layer 23.

A p-type dopant is located in a region 28 that has a depth of about 100 to 500 Angstroms below the top of substrate 10 and extends across active areas 15, 16. An indium dopant is located in regions 20 of substrate 10 near the top of liner 17 along sidewalls of trenches 14a, 14b. Region 20 also extends under gate dielectric layer 24 up to a distance of 0 to about 1000 Angstroms from liner 17. The thickness of region 20 is from about 30 to 1000 Angstroms and the indium dopant is present at a concentration between about $10^{14}$ and $10^{19}$ ions/cm$^3$.

In one embodiment, a third dopant is located in a region 22 below STI features 14a, 14b and is a p-type dopant such as boron or indium. Region 22 has a thickness of about 30 to 1000 Angstroms and a width that is similar to the width of the bottom of STI features 14a, 14b.

The advantage of NMOS transistor 40 over other NMOS transistor structures is the presence of an indium dopant in regions 20. The indium dopant mitigates the effect of a localized electric field that is induced by the gate layer 25 in groove 26. In prior art structures, this localized electric field causes gate leakage and a Vt roll-off that leads to a loss in reliability and performance in the NMOS transistor. The effectiveness of the indium dopant in substrate regions 20 in improving the long channel NMOS Vt roll-off is demonstrated in FIG. 8. A plot of mask width (represented by $w_3$ or $w_4$ in FIG. 1a) vs. Vt is shown for a long channel width 27 of 10 microns. Curve 80 indicates how Vt decreases rapidly (high degree of roll-off) with a shrinking width $w_3$ (or $w_4$) in a standard process with no indium implant region 20 in a NMOS transistor structure. The situation is improved in curve 81 which represents NMOS transistor structure 40 having doped regions 20 with an indium concentration of about $5 \times 10^{18}$ ions/cm$^3$. A 40 mVolt improvement is noted on the plot (separation of curves 80 and 81) for the smallest mask width of 0.11 microns. Curve 82 indicates that a higher indium concentration of about $7 \times 10^{18}$ ions/cm$^3$ in the NMOS transistor structure 40 is capable of improving the Vt roll-off even further than a lower indium concentration represented by curve 81.

Referring to FIG. 9, a plot of mask width (represented by $w_3$ or $w_4$ in FIG. 11) vs. Vt is shown for a short channel width 27 of 0.1 microns. Curve 90 indicates how Vt decreases rapidly (high degree of roll-off) as width $w_3$ (or $w_4$) shrinks below about 0.24 microns in a standard NMOS transistor structure with no indium implant region 20. The situation is improved in curve 91 which represents a NMOS transistor structure 40 having doped regions 20 with an indium concentration of about $5 \times 10^{18}$ ions/cm$^3$. A 45 mVolt improvement from curve 90 to 91 is noted on the plot for the smallest mask width of 0.11 microns. Curve 92 indicates that a higher indium concentration of about $7 \times 10^{18}$ ions/cm$^3$ in region 20 of NMOS transistor structure 40 is capable of improving the Vt roll-off even further than a lower indium concentration represented by curve 91.

The improvement in Vt roll-off is achieved in NMOS transistor structure 40 without a loss in junction or isolation performance. The indium dopant in region 20 is preferred over a boron dopant which has a higher tendency to migrate during thermal treatments in the device fabrication scheme and thereby lessen the concentration of dopant in region 20 in the final device.

While this invention has been particularly shown and described with reference to, the preferred embodiment thereof, it will be understood by those skilled in the art that various changes in form and details may be made without departing from the spirit and scope of this invention.

We claim:

1. A NMOS transistor having an improved narrow width Vt roll-off, comprising:
    a substrate that includes shallow trench isolation (STI) features which are comprised of a shallow trench with sloped sidewalls and a bottom, an oxide liner formed on said shallow trench sidewalls and bottom, and an insulator layer formed on said oxide liner that fills said shallow trench and extends to a level that is above the top of said substrate, wherein a groove is formed at top corners of said shallow trench;
    an active area formed between two adjacent shallow trenches in said substrate, said active area having an indium doped region that is adjacent to the groove;
    a gate dielectric layer formed on said active areas; and
    a patterned gate layer formed on said gate dielectric layer wherein said gate layer extends over said adjacent shallow trenches.

2. The NMOS transistor of claim 1 wherein said substrate is also comprised of a second p-type dopant in said active areas.

3. The NMOS transistor of claim 1 wherein the depth of said shallow trench is about 1500 to 5000 Angstroms and the width of the shallow trench ranges from less than 100 nm to several microns.

4. The NMOS transistor of claim 1 wherein said oxide liner has a thickness of about 50 to 300 Angstroms.

5. The NMOS transistor of claim 1 wherein said insulator layer is comprised of SiO$_2$ or a low k dielectric material.

6. The NMOS transistor of claim 1 wherein said indium doped region has an indium concentration from about $10^{14}$ to $10^{19}$ ions/cm$^3$ and has a thickness in the range of about 30 to 1000 Angstroms.

7. The NMOS transistor of claim 1 wherein said indium doped region extends away from said shallow trench to a distance between 0 and about 1000 Angstroms.

8. The NMOS transistor of claim 1 wherein said gate dielectric layer is comprised of SiO$_2$ or an upper high k dielectric metal oxide layer on a lower interfacial layer.

9. The NMOS transistor of claim 1 wherein said gate layer has a thickness of about 300 to 5000 Angstroms and forms a conformal layer on said gate dielectric layer and on said adjacent STI features.

10. The NMOS transistor of claim 1 wherein said gate layer is comprised of doped polysilicon.

11. The NMOS transistor of claim 1 wherein said gate layer is comprised of undoped polysilicon or amorphous silicon.

12. A NMOS transistor having an improved narrow width Vt roll-off, comprising:
    a substrate that includes shallow trench isolation (STI) features which are comprised of a shallow trench with sloped sidewalls and a bottom, an oxide liner formed on said shallow trench sidewalls and bottom, and an insulator layer formed on said oxide liner that fills said shallow trench and extends to a level that is above the top of said substrate;
    an active area formed between two adjacent shallow trenches in said substrate;
    a gate dielectric layer formed on said active areas; and
    a patterned gate layer formed on said gate dielectric layer wherein said gate layer extends over said adjacent shallow trenches;
    wherein said active area having an indium doped region that is adjacent to top corners of said shallow trenches and extends under part of the gate dielectric layer.

13. The NMOS transistor of claim 12 wherein said substrate is also comprised of a second p-type dopant in said active areas.

14. The NMOS transistor of claim 12 wherein the depth of said shallow trench is about 1500 to 5000 Angstroms and the width of the shallow trench ranges from less than 100 nm to several microns.

15. The NMOS transistor of claim 12 wherein said oxide liner has a thickness of about 50 to 300 Angstroms.

16. The NMOS transistor of claim 12 wherein said insulator layer is comprised of SiO$_2$ or a low k dielectric material.

17. The NMOS transistor of claim 12 wherein said indium doped region has an indium concentration from about $10^{14}$ to $10^{19}$ ions/cm$^3$ and has a thickness in the range of about 30 to 1000 Angstroms.

18. The NMOS transistor of claim 12 wherein said indium doped region extends away from said shallow trench to a distance between 0 and about 1000 Angstroms.

19. The NMOS transistor of claim 12 wherein said gate dielectric layer is comprised of SiO$_2$ or an upper high k dielectric metal oxide layer on a lower interfacial layer.

20. The NMOS transistor of claim 12 wherein said gate layer has a thickness of about 300 to 5000 Angstroms and forms a conformal layer on said gate dielectric layer and on said adjacent STI features.

* * * * *